(12) United States Patent
Yang

(10) Patent No.: US 6,983,444 B2
(45) Date of Patent: Jan. 3, 2006

(54) MASK FOR REDUCING PROXIMITY EFFECT

(75) Inventor: Chin Cheng Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 66 days.

(21) Appl. No.: 10/633,070

(22) Filed: Aug. 1, 2003

(65) Prior Publication Data
US 2005/0026047 A1 Feb. 3, 2005

(51) Int. Cl.
*G06F 17/50* (2006.01)
(52) U.S. Cl. .............................. 716/19; 716/21; 430/5; 430/296; 430/311; 430/394
(58) Field of Classification Search ................. 716/19, 716/21; 430/5, 296, 311, 394
See application file for complete search history.

(56) References Cited

U.S. PATENT DOCUMENTS

| 5,242,770 A | 9/1993 | Chen et al. |
| 5,636,002 A * | 6/1997 | Garofalo ........................ 355/53 |
| 6,165,693 A * | 12/2000 | Lin et al. ..................... 430/311 |
| 6,627,361 B2 * | 9/2003 | Bula et al. ..................... 430/5 |
| 2002/0192570 A1 * | 12/2002 | Smith ............................. 430/5 |

* cited by examiner

Primary Examiner—Vuthe Siek
(74) Attorney, Agent, or Firm—Seyfarth Shaw LLP

(57) ABSTRACT

The present invention discloses a mask for reducing the proximity effect. The mask comprises a plurality of line-shaped features, a plurality of first assist features positioned between the line-shaped features and a plurality of second assist features positioned between the line-shaped feature and the first assist feature. The line-shaped feature corresponds to isolation trenches to be formed on a silicon wafer. The first assist feature is rectangular in shape and has a larger width at the direction perpendicular to the line-shaped features. The width of the second assist feature is smaller than two-fifths of the wavelength but larger than one-fourth of the wavelength of an exposure source. The size of the first assist feature and the second assist feature is so designed to be non-resolvable, while the line-shaped feature is resolvable and transferred to the silicon wafer.

8 Claims, 9 Drawing Sheets ized or densely packed) to other features. U.S. Pat. No. 5,242,770 discloses a technique for reducing this disparity by placing non-resolvable scattering bars, also referred to as assist features, next to isolated edges of features such that features having isolated edges and features having densely packed edges transfer approximately the same if their original mask dimensions are the same.

MASK FOR REDUCING PROXIMITY EFFECT

BACKGROUND OF THE INVENTION

1. Field of the Invention

The present invention relates to a mask for reducing proximity effect, and more particularly, to a mask with a plurality of ladder-shaped assist features for reducing proximity effect. Those ladder-shaped assist features will make the iso space patterns become more line-space patterns like. Not only the process window, but also the image contrast will improve.

2. Description of Related Art

Conventional processes for the fabrication of semiconductor wafers often incorporate a lithographic process to create a desired pattern on a silicon wafer. In the photolithography technology, a limitation R for representing a dimension of a minimum pattern is represented by the Rayleigh formula:

$$R = k_1 \lambda / NA$$

Where the $k_1$ is a constant depending upon the photolithography process;
$\lambda$ is a wavelength of an exposure light; and
NA is a numeral aperture of an exposure system.
Therefore, the higher NA, the better R.
On the other hand, a depth-of-focus (DoF) is represented by $$DoF = k_2 \lambda / (NA)^2$$

Where the $k_2$ is a constant depending upon the photolithography process;

Therefore, the higher NA, the smaller DoF. Due to serious impact to process window, the limit resolution R cannot be reduced by only enlarging NA. In order to reduce the limit resolution without changing NA, various super resolution techniques have been developed. One is to improve illumination systems from conventional mode to annular, quasar or dipole mode. Another is to improve the iso-focal curve by adding assist feature, especially for iso line or iso space.

As the size of the critical dimensions (CD) of the desired pattern shrinks and approaches the resolution value of the lithography equipment, the consistency between the masked and actual layout pattern developed in the photoresist on the silicon wafer is significantly reduced. Specifically, it is observed that differences in pattern development of circuit features depend upon the proximity of the features to one another. Proximity effect in a lithographic process can arise during exposure, resist pattern formation and subsequent pattern transfer steps such as etching. The magnitude of the effect depends on the proximity of the two features present on the masking pattern. Proximity effect is known to result from optical diffraction in the projection system. This diffraction causes adjacent features to interact with one another in such a way to produce pattern-dependent variations.

One type of proximity effect seen in lithographic process is that features having same dimensions on a mask transfer more differently than other features (i.e., have different dimensions) depending on their proximity (i.e. relatively isolated or densely packed) to other features. U.S. Pat. No. 5,242,770 discloses a technique for reducing this disparity by placing non-resolvable scattering bars, also referred to as assist features, next to isolated edges of features such that features having isolated edges and features having densely packed edges transfer approximately the same if their original mask dimensions are the same.

FIG. 1 is a schematic diagram showing a mask 10 disclosed in U.S. Pat. No. 5,242,770. As shown in FIG. 1, the mask 10 includes a plurality of primary features 30–34. The primary feature 32 has isolated edges A1 and A3 and a densely packed edge A2. According to U.S. Pat. No. 5,242,770, assist features 35 and 36 are positioned on two sides of the primary feature 32 and keep a predetermined space from the primary feature 32 so that the isolated edge A3 becomes a corrected edge compared with the isolated edge A1.

According to U.S. Pat. No. 5,242,770, assist features 35 and 36 have a nominal/preferred width, which according to this technique was empirically determined to be ⅕, the critical dimension of the lithographic process and a preferred spacing from edges (also empirically determined) of 1.1 times the critical dimension (for clear field masks). Using, as an example, the 365 nanometer (or 0.365 micron) wavelength of a conventional mercury I-line emission exposure source currently used in the lithographic technology, the nominal scattering bar width is chosen to be 0.1 micron. However, the maximum permissible scattering bar width can be up to or near 0.125 micron such that the scattering bars remain irresolvable.

As the size of the critical dimension shrinks rapidly, the prior art cannot meet the future requirement and possesses the following disadvantages:
1. Without the assist feature design, the process window of the lithographic process cannot meet the product criteria (especially for iso trench or iso line pattern) and the mask error enhancement factor (MEEF) will be too large.
2. With assist feature design such as the technique disclosed in U.S. Pat. No. 5,242,770, the process window may not be enough for product criteria for an even smaller isolation trench design rule. Besides, the location and the number of the assist features are not easy for design.

SUMMARY OF THE INVENTION

The objective of the present invention is to provide a mask with a plurality of ladder-shaped assist features for reducing proximity effect. This invention will make the iso trench pattern become line-space dense like pattern. Not only the process window, but also the image contrast will improve.

In order to achieve the above-mentioned objective and avoid the problems of the prior art, the present invention provides a mask for reducing the proximity effect. The mask comprises a plurality of line-shaped features, a plurality of first assist features positioned between the line-shaped features and a plurality of second assist features positioned between the line-shaped feature and the first assist feature. The line-shaped feature corresponds to isolation trenches to be formed on a silicon wafer. The first assist feature is rectangular in shape and has a larger width at the direction perpendicular to the line-shaped features. The length of the first assist feature is smaller than two-fifths of the wavelength but larger than one-fourth of the wavelength of an exposure source. The width of the second assist feature is smaller than two-fifths of the wavelength but larger than one-fourth of the wavelength of the exposure source. The size of the first assist feature and the second assist feature is so designed to be non-resolvable, while the line-shaped feature is resolvable and transferred to the silicon wafer.

Compared with the prior art, the depth-of-focus is further improved, the process window is wider and the resolution is extended according to the present invention. This present invention also improves the image contrast and mask error enhancement factor (MEEF), thus the resolution and critical dimension uniformity is also improved. Additionally, the location and number of the ladder-shaped assist feature are easy friendly to design, and therefore the present invention is adaptable to the present lithographic system without changing the process and increasing the production cost.

BRIEF DESCRIPTION OF THE DRAWINGS

Other objects and advantages of the present invention will become apparent upon reading the following description and upon reference to the accompanying drawings in which.

PREFERRED EMBODIMENT OF THE PRESENT INVENTION

Figure 1:
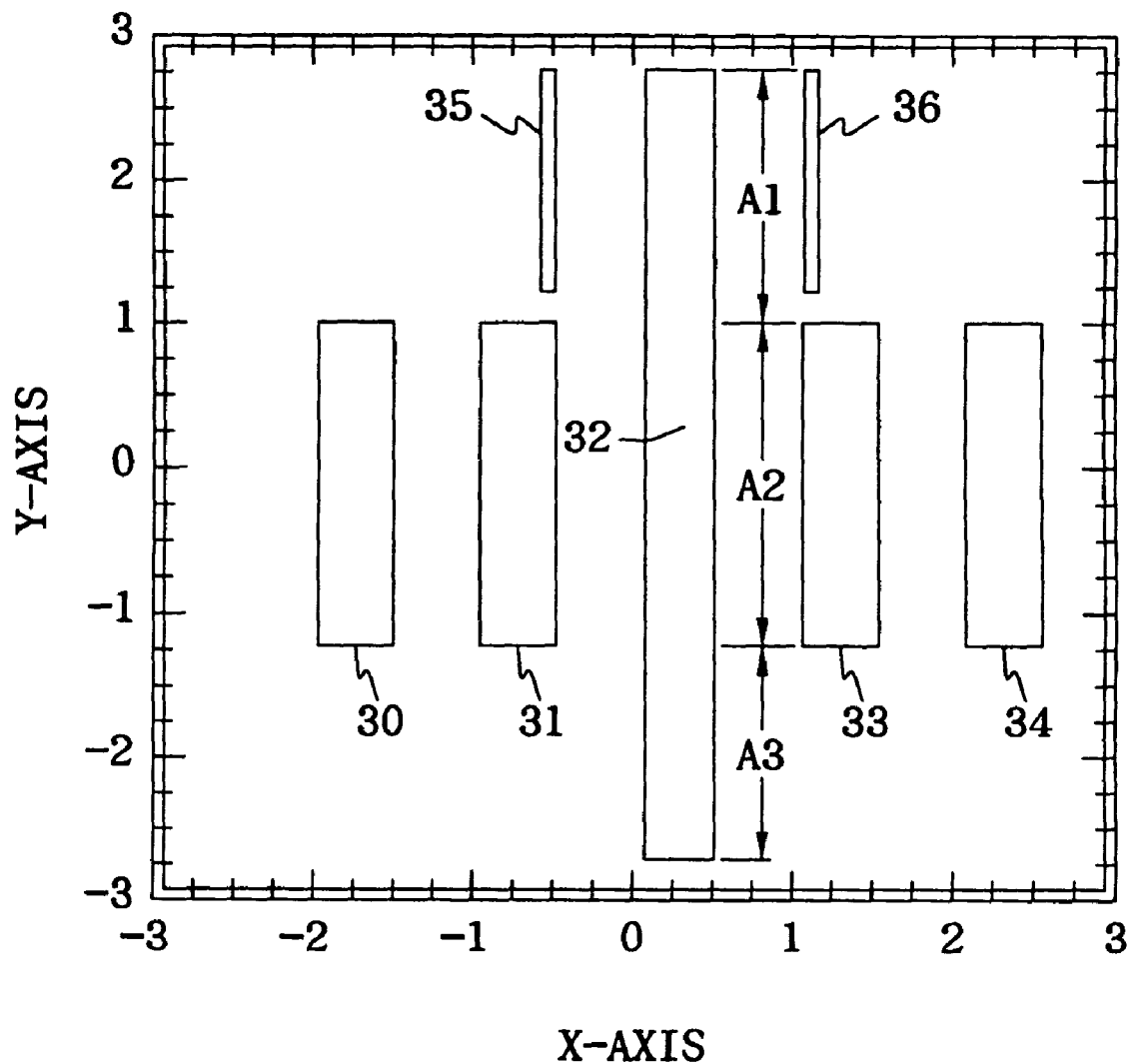
FIG. 1 is a schematic diagram showing a mask disclosed in U.S. Pat. No. 5,242,770.
Figure 2:
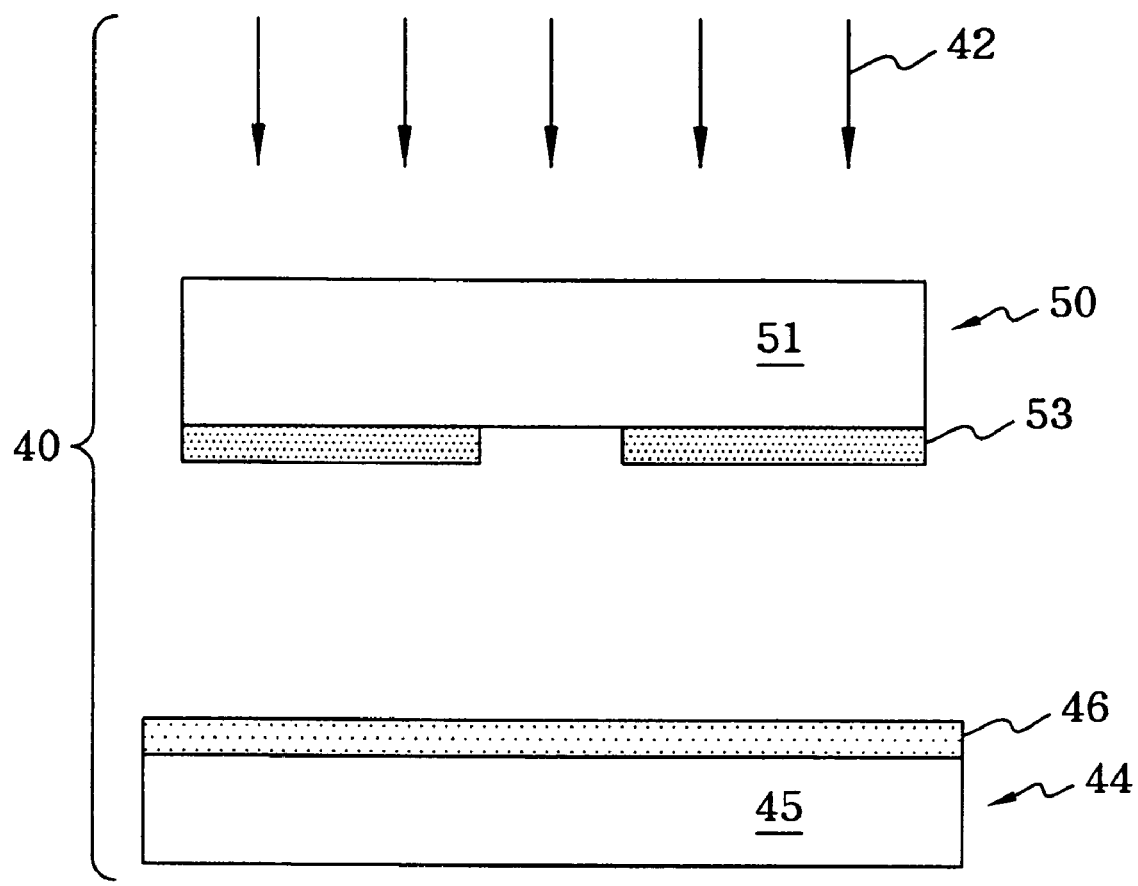
FIG. 2 shows a lithographic system for forming isolation trenches on a silicon wafer according to the present invention.

FIG. 2 shows a lithographic system 40 for forming isolation trenches on a silicon wafer 44 according to the present invention. The lithographic system 40 comprises an exposure source 42, a mask 50 and a silicon wafer 44. The silicon wafer 44 comprises a substrate 45 and a photoresist layer 46 on the substrate 45. The mask 50 comprises a quartz substrate 51 and a pattern form of an absorptive layer 53 on the quartz substrate 51. The pattern formed of the absorptive layer 53 corresponds to the isolation trenches to be formed on the silicon wafer 44 and is transferred to the photoresist layer 46 on the substrate 45 through a lithographic process.

Figure 3A:
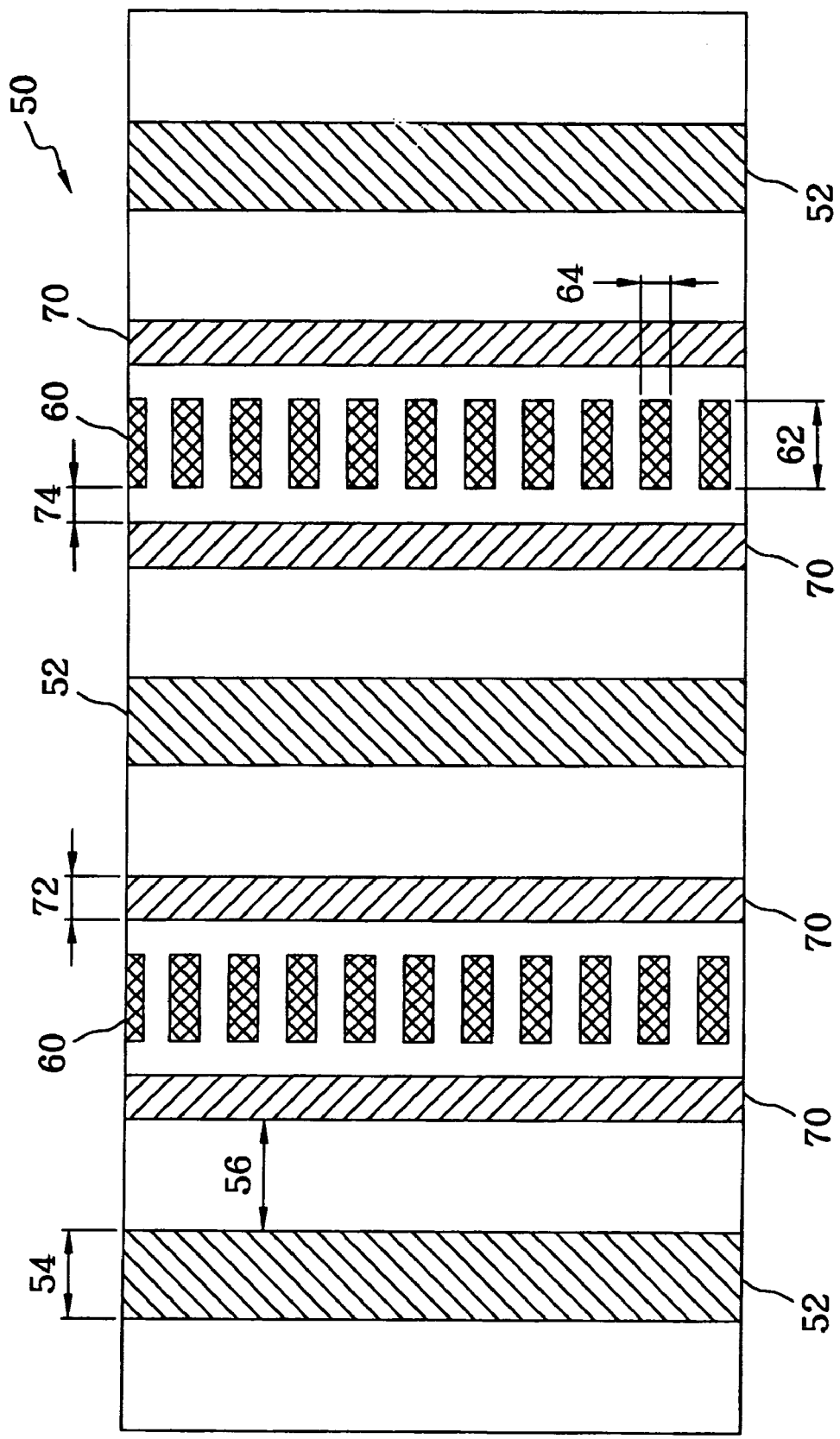
FIGS. 3(a) and 3(b) show a comparison between the close-up diagrams of the masks for forming 0.12-micrometer isolation trenches of the present invention and U.S. Pat. No. 5,242,770.

FIG. 3(a) is a close-up diagram for the first embodiment of the mask 50 for forming 0.12-micrometer isolation trenches according to the present invention. The pattern of the mask 50 comprises a plurality of line-shaped features 52, a plurality of groups of first assist features 60 (each group of first assist features 60 positioned between two adjacent line-shaped features 52), and a plurality of second assist features 70 positioned between the line-shaped features 52 and the groups of first assist features 60. Each of the line-shaped features 52 corresponds to one isolation trench to be formed on the silicon wafer 44. The first assist feature 60 is approximately rectangular in shape and the width 62 at the direction perpendicular to the line-shaped feature 52 is larger than the length 64 at the direction parallel to the line-shaped feature 52. Since the first assist feature 60 is arranged in perpendicular to the line-shaped feature 52 and looks like a ladder, it is named a ladder-shaped assist feature.

In order to keep the first assist feature 60 non-resolvable, the length 64 of the first assist feature 60 is preferably smaller than two-fifths of the wavelength but larger than one-fourth of the wavelength of the exposure source 42. And the space between two adjacent first assist features 60 is equal or larger than the length 64 of the first assist feature 60. In order to keep the second assist feature 70 non-resolvable, the width 72 of the second assist feature is preferably smaller than two-fifths of the wavelength but larger than one-fourth of the wavelength of the exposure source 42. The space 56 between the line-shaped feature 52 and the second assist feature 70 is equal to or larger than the width 54 of the line-shaped feature 52. The space 74 between the first assist feature 60 and the second assist feature 70 is equal to or larger than the width 72 of the second assist feature 70. The width 72 of the second assist feature 70 is equal or close to the length 64 of the first assist feature 60 at the direction parallel to the second assist feature 70.

Figure 3B:
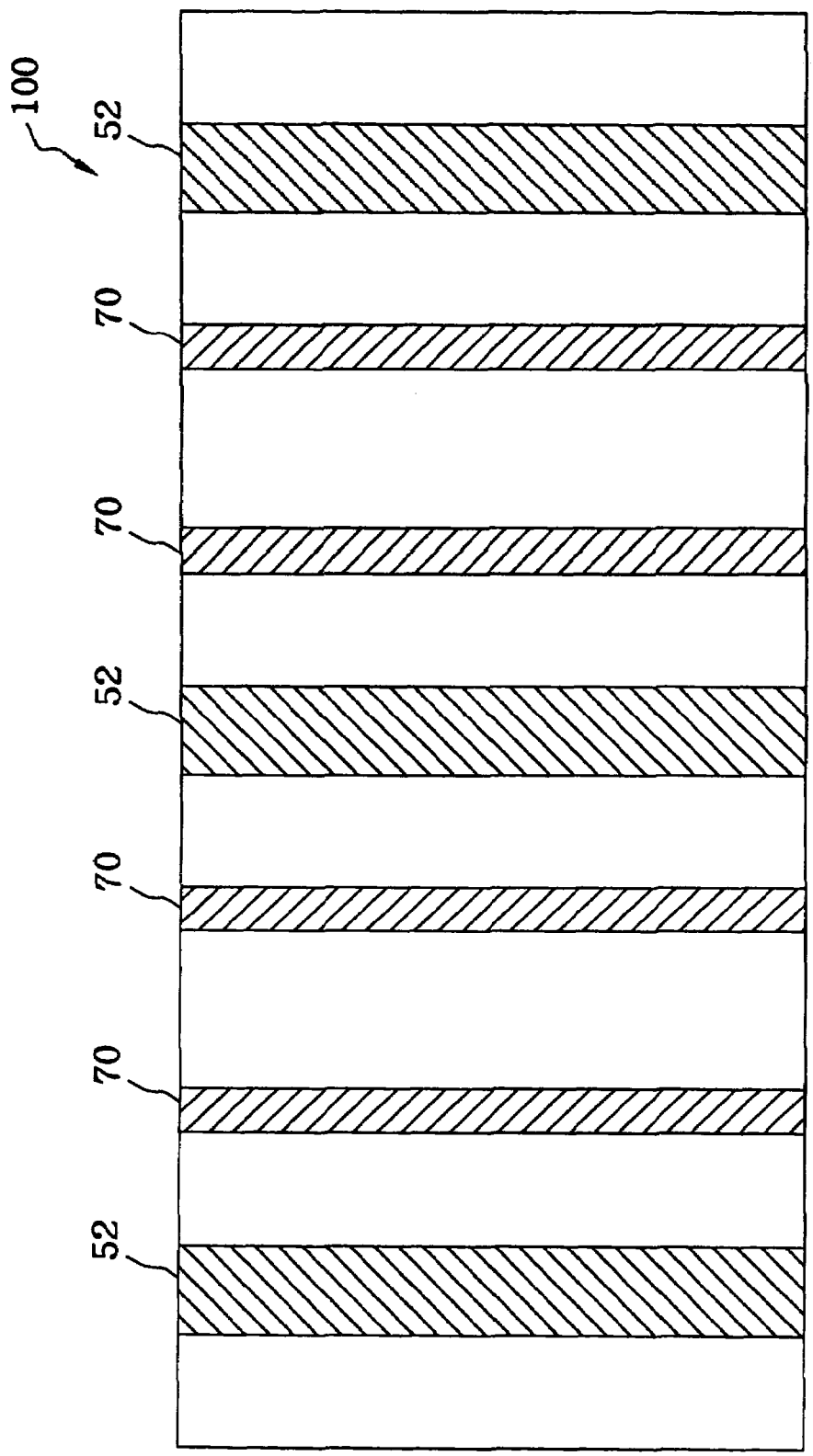

FIG. 3(b) is a close-up diagram of the mask 100 disclosed in U.S. Pat. No. 5,242,770, which forms a 0.12-micrometer isolation trench. The difference between FIG. 3(a) and FIG. 3(b) is that the first assist feature 60 of the present invention positioned between two adjacent second assist features 70.

Figure 4:
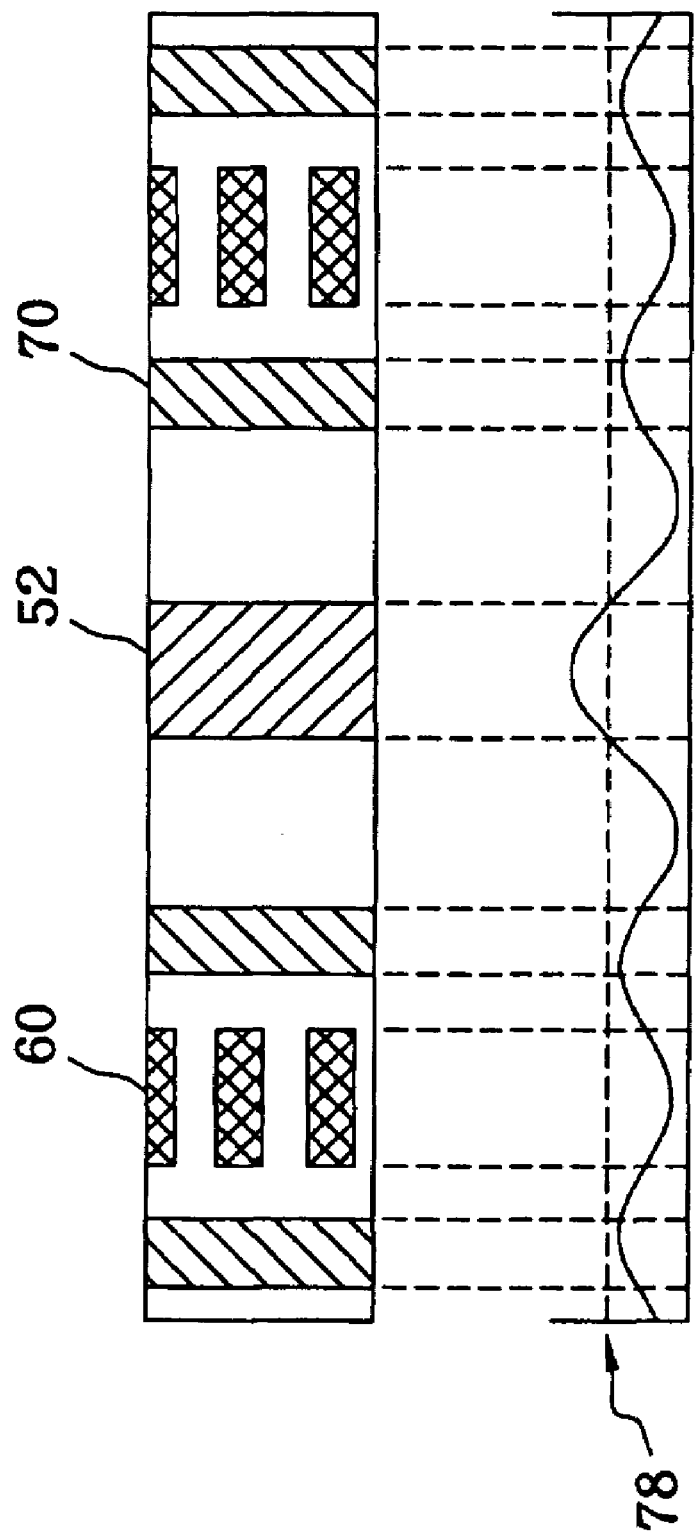
FIG. 4 shows the intensity of the exposure source on the photoresist layer according to the present invention.

FIG. 4 shows the intensity diagram of the exposure source 42 on the photoresist layer 46 according to the present invention. Theoretically, the center of the features should have the highest intensity, such as that the line-shaped feature 52 has the highest intensity at its center. However, the highest intensity for the second assist feature 70 shifts from the center, and more particularly, the intensity at the center of the first assist feature 60 is the lowest. The reason for this phenomenon is caused by occurrence of the destructive interference of the exposure source 42 on the photoresist layer 46. If the exposure intensity for the photoresist layer 46 is set at the level as indicated by the line 78, only the line-shaped feature 52 will be developed, and the first and second assist features 60, 70 will not be developed and remain non-resolvable.

Figure 5A:
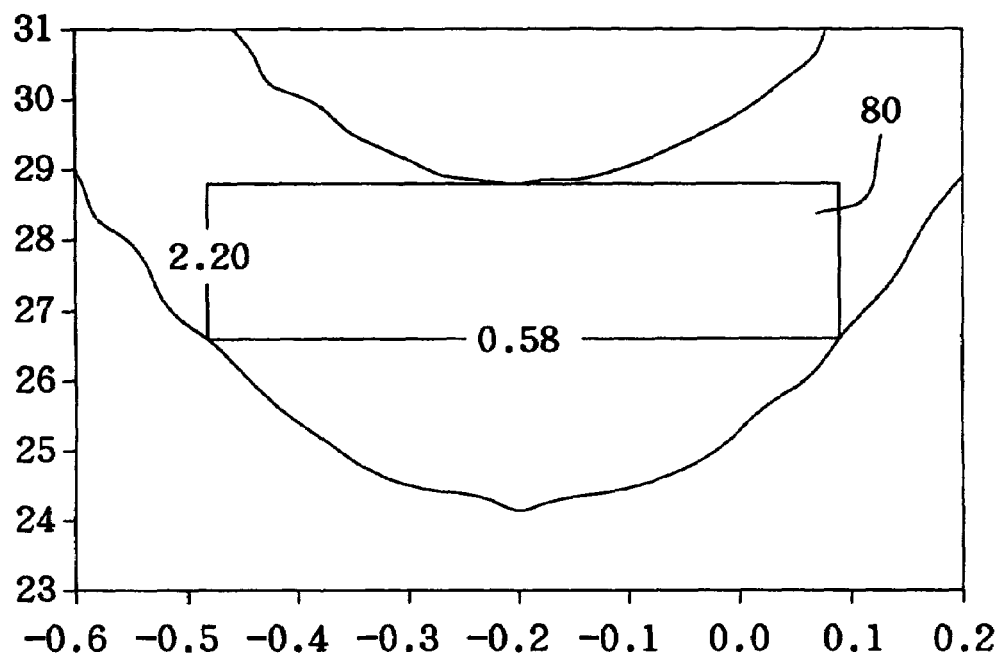
FIGS. 5(a) and 5(b) show a comparison between the process windows of the masks of the present invention and U.S. Pat. No. 5,242,770.
Figure 5B:
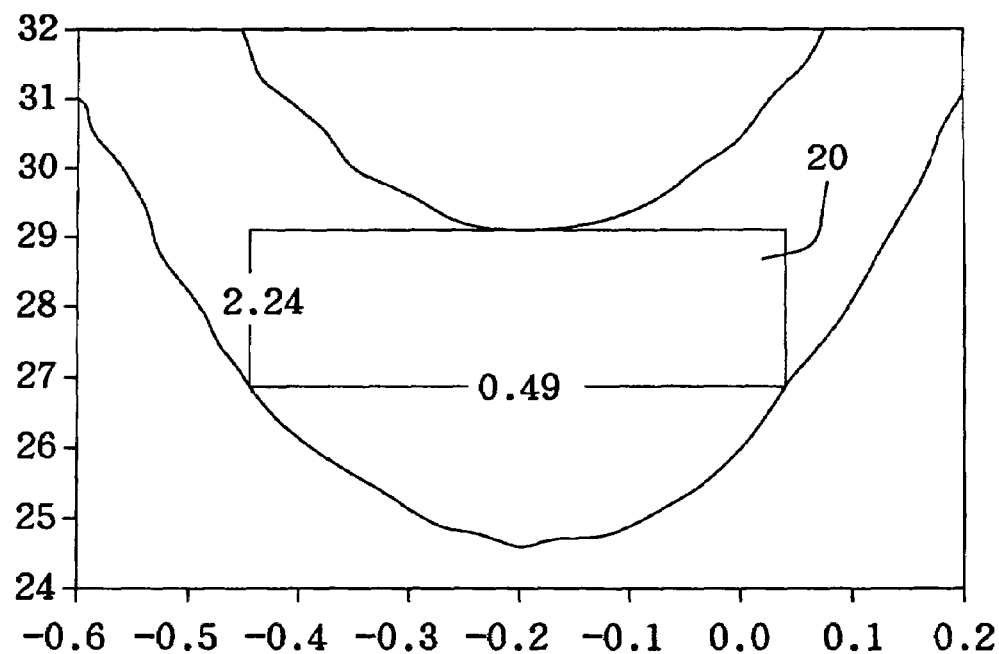

FIG. 5(a) shows a process window 80 of the mask 50 according to the present invention, and FIG. 5(b) shows a process window 20 of the mask 100 as disclosed in U.S. Pat. No. 5,242,770. The DOF of the prior art process window 20 is only 0.49 micrometer, and the DOF of the process window 80 of the present invention is further improved up to 0.58 micrometer, i.e. the present invention improves the DOF. Additionally, comparing FIG. 5(a) with FIG. 5(b), it is obvious that the process window 80 is wider than the process window 20, i.e. the present invention can improve the process window and extend the resolution for forming the 0.12-micrometer isolation trench.

Figure 6A:
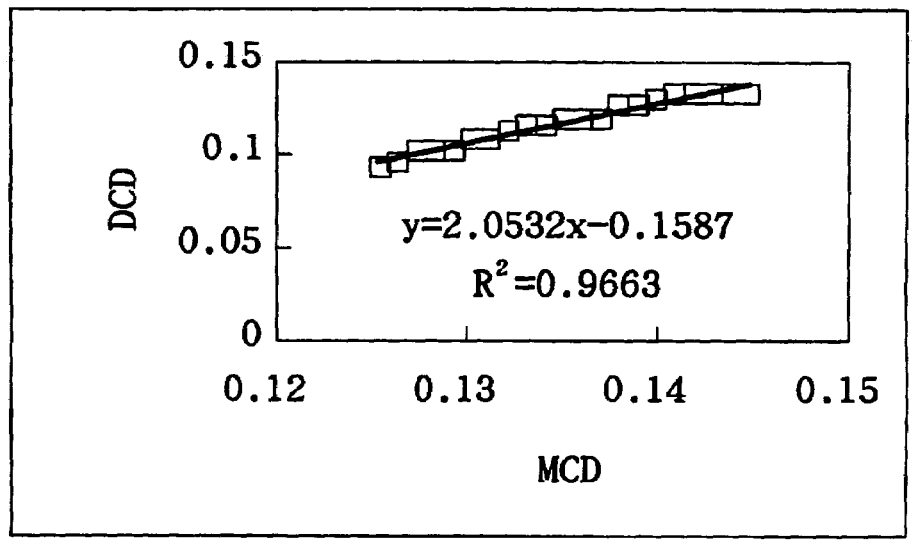
FIGS. 6(a) and 6(b) show a comparison between the MEEFs of the masks of the present invention and U.S. Pat. No. 5,242,770.
Figure 6B:
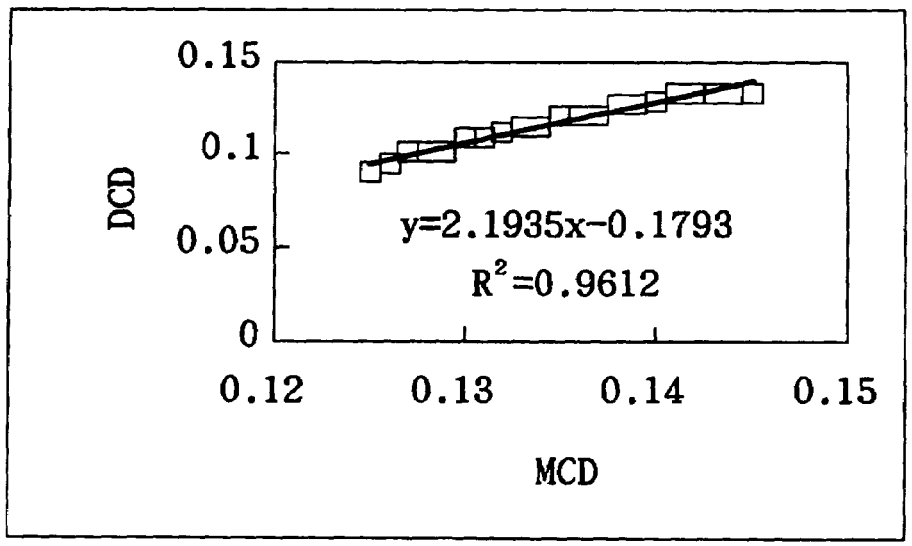

FIG. 6(a) shows the mask error enhancement factor (MEEF) of the mask 50 according to the present invention, and FIG. 6(b) shows the MEEF of the mask 100 as disclosed in U.S. Pat. No. 5,242,770. As shown in FIG. 6(a) and FIG. 6(b), the MEEF of the mask 50 according to the present invention is only 2.05, while the prior art MEEF of the mask 100 is 2.19, i.e. the present invention can reduce the value of MEEF.

Figure 7A:
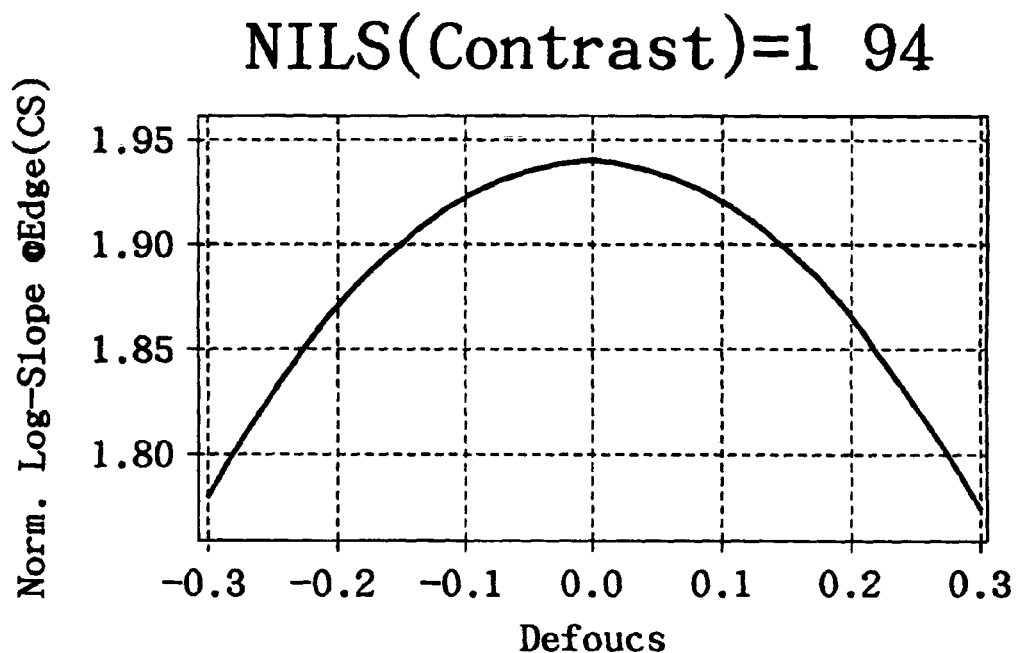
FIGS. 7(a) and 7(b) show a comparison between the image contrasts of the masks of the present invention and U.S. Pat. No. 5,242,770.
Figure 7B:
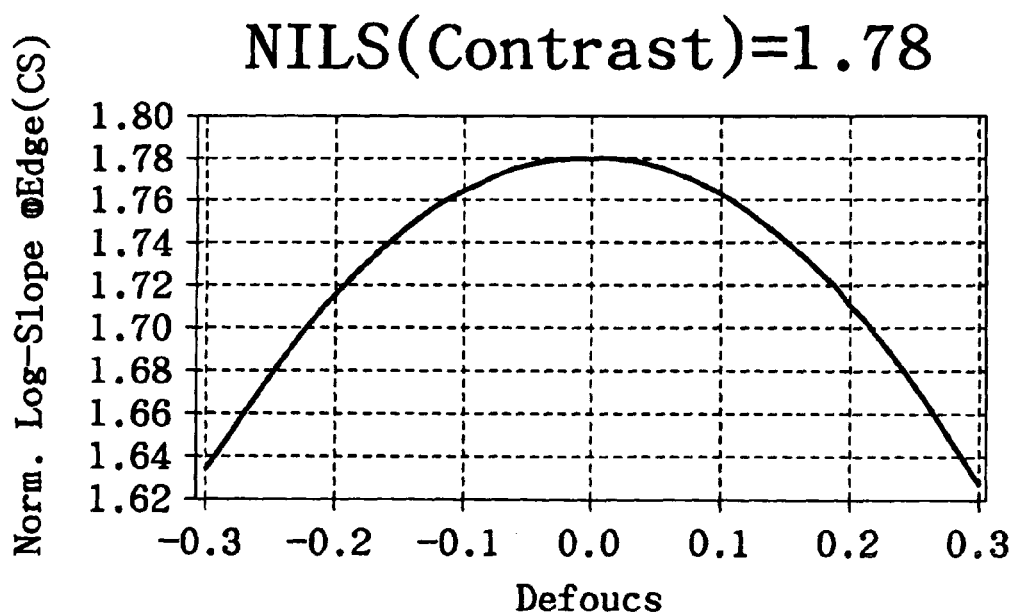

FIG. 7(a) shows the image contrast of the mask 50 according to the present invention, and FIG. 7(b) shows the image contrast of the mask 100 as disclosed in U.S. Pat. No. 5,242,770. As shown in FIG. 7(a) and FIG. 7(b), the image contrast of the mask 50 according to the present invention is up to 1.94, while the image contrast of the prior art mask 100 is only 1.78, i.e. the present invention can improve the image contrast and the resolution.

Figure 8:
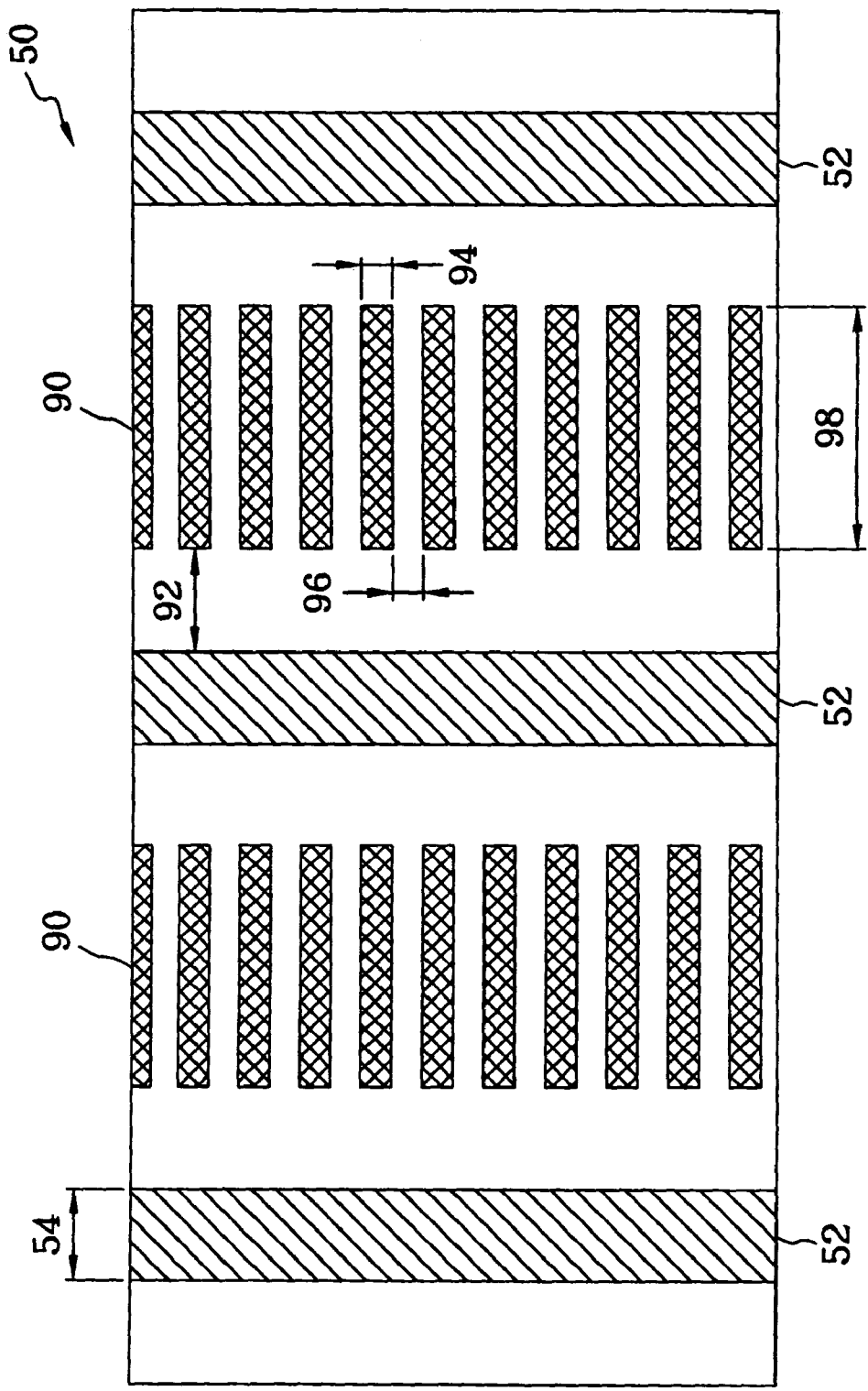
FIG. 8 is a close-up diagram of the second embodiment of the mask forming 0.12-micrometer isolation trenches according to the present invention.

FIG. 8 is a close-up diagram of the second embodiment of the mask 50 for forming the 0.12-micrometer isolation trench according to the present invention. The pattern of the mask 50 comprises a plurality of line-shaped features 52 and a plurality of groups of third assist features 90, wherein each group of third assist features is positioned between two adjacent line-shaped features 52. In order to keep the third assist feature 90 non-resolvable, the space 92 between the line-shaped feature 52 and the group of the third assist feature 90 is larger than the width 54 of the line-shaped feature 52. The length 94 of the third assist feature 90 is preferably smaller than two-fifths of the wavelength but larger than one-fourth of the wavelength of an exposure source. The space 96 between two adjacent third assist features 90 is larger than the length 94 of the third assist feature 90. The third assist feature 90 can be approximately rectangular in shape and the width 98 at the direction perpendicular to the line-shaped feature 52 is larger than the length 94 at the direction parallel to the line-shaped feature 52. Comparing the design of FIG. 3 with FIG. 8, it is obvious that the location and number of the ladder-shaped assist feature (assist feature 60 and 90) is design-friendly. Therefore, the present invention is adaptable to the present lithographic system without process change and cost increase.

Compared with the prior art, the depth-of-focus of the present invention is improved, and the process window is wider and the resolution is extended. Since the MEEF and contrast is improved, the critical dimension uniformity and resolution are enhanced. Additionally, the location and number of the ladder-shaped assist feature is design-friendly, and therefore the present invention is adaptable to the present lithographic system without changing the process and increasing the production cost.

The above-described embodiments of the present invention are intended to be illustrative only. Numerous alternative embodiments may be devised by those skilled in the art without departing from the scope of the following claims.

What is claimed is:

1. A mask for reducing proximity effect, comprising:
   a plurality of line-shaped features;
   a plurality of groups of first assist features, each group of first assist features positioned between two adjacent line-shaped features, wherein the first assist feature is approximately rectangular in shape and the width of the first assist feature is larger than the length of the first assist feature; and
   a plurality of second assist features, each of the plurality of second assist features positioned between one of the plurality of line-shaped features and one group of first assist features, wherein the width of the second assist feature is smaller than two-fifths but larger than one-fourth of the wavelength of an exposure source.

2. The mask for reducing proximity effect of claim 1, wherein the width of the second assist feature is equal or close to the length of the first assist feature.

3. The mask for reducing proximity effect of claim 1, wherein the space between the group of first assist features and the second assist feature is equal to or larger than the width of the second assist feature.

4. The mask for reducing proximity effect of claim 1, wherein the space between the line-shaped feature and the second assist feature is larger than the width of the line-shaped feature.

5. The mask for reducing proximity effect of claim 1, wherein the line-shaped feature corresponds to an isolation trench pattern to be formed on a wafer.

6. A mask for reducing proximity effect, comprising:
   a plurality of line-shaped features; and
   a plurality of groups of assist features, each group of assist features positioned between two adjacent line-shaped features, wherein the assist feature is approximately rectangular in shape, the width of the assist feature is larger than the length of the assist feature, and the length of the assist feature is smaller than two-fifths but larger than one-fourth of the wavelength of an exposure source.

7. The mask for reducing proximity effect of claim 6, wherein the space between one of the plurality of line-shaped features and one group of assist feature is larger than the width of the line-shaped feature.

8. The mask for reducing proximity effect of claim 6, wherein the space between the adjacent assist features is larger than the length of the assist feature.

* * * * *